United States Patent
Kato et al.

(10) Patent No.: US 8,876,973 B2
(45) Date of Patent: Nov. 4, 2014

(54) FILM OF N TYPE (100) ORIENTED SINGLE CRYSTAL DIAMOND SEMICONDUCTOR DOPED WITH PHOSPHOROUS ATOMS, AND A METHOD OF PRODUCING THE SAME

(75) Inventors: Hiromitsu Kato, Tsukuba (JP); Satoshi Yamasaki, Tsukuba (JP); Hideyo Ookushi, Tsukuba (JP); Shinichi Shikata, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/344,104

(22) Filed: Jan. 5, 2012

(65) Prior Publication Data
US 2012/0103250 A1    May 3, 2012

Related U.S. Application Data

(63) Continuation of application No. 13/074,284, filed on Mar. 29, 2011, now abandoned, which is a continuation of application No. 11/883,488, filed as application No. PCT/JP2006/301210 on Jan. 26, 2006, now abandoned.

(30) Foreign Application Priority Data

Feb. 3, 2005  (JP) ................................. 2005-027181

(51) Int. Cl.
C30B 23/00 (2006.01)
C30B 25/00 (2006.01)
(Continued)

(52) U.S. Cl.
CPC ............... *C30B 25/105* (2013.01); *C30B 25/18* (2013.01); *C30B 29/40* (2013.01); *C30B 25/02*
(Continued)

(58) Field of Classification Search
None
See application file for complete search history.

(56) References Cited

U.S. PATENT DOCUMENTS

| 4,982,243 A | 1/1991 | Nakahata et al. |
| 5,051,785 A | 9/1991 | Beetz et al. |

(Continued)

FOREIGN PATENT DOCUMENTS

| JP | 1-103993 A | 4/1989 |
| WO | WO 00/58534 A1 | 10/2000 |
| WO | WO 03/106743 A1 | 12/2003 |

OTHER PUBLICATIONS

Haenen et al.; Phonon-Assisted Electronic TRansitions in Phosphorous-Doped N-Type Chemical Vapor Deposition Diamond Films; Diamond and Related Materials; vol. 10, Issues 3-7; pp. 439-443; 2001.*

(Continued)

*Primary Examiner* — Guinever Gregorio
(74) *Attorney, Agent, or Firm* — Birch, Stewart, Kolasch & Birch, LLP

(57) ABSTRACT

There is provided an n type (100) oriented single crystal diamond semiconductor film into which phosphorous atoms have been doped and a method of producing the same. The n type (100) oriented single crystal diamond semiconductor film, characterized in that (100) oriented diamond is epitaxially grown on a substrate under such conditions that; the diamond substrate is (100) oriented diamond, a means for chemical vapor deposition provides hydrogen, hydrocarbon and a phosphorous compound in the plasma vapor phase, the ratio of phosphorous atoms to carbon atoms in the plasma vapor phase is no less than 0.1%, and the ratio of carbon atoms to hydrogen atoms is no less than 0.05%, and the method of producing the same.

8 Claims, 4 Drawing Sheets

(51) Int. Cl.
| | |
|---|---|
| C30B 28/12 | (2006.01) |
| C30B 28/14 | (2006.01) |
| B01J 3/06 | (2006.01) |
| B32B 9/00 | (2006.01) |
| C30B 29/04 | (2006.01) |
| C30B 25/10 | (2006.01) |
| C30B 29/40 | (2006.01) |
| C30B 25/02 | (2006.01) |
| C30B 25/20 | (2006.01) |
| H01L 21/02 | (2006.01) |
| C30B 25/18 | (2006.01) |

(52) U.S. Cl.
CPC ........ (2013.01); *C30B 25/20* (2013.01); *C30B 29/04* (2013.01); *H01L 21/02376* (2013.01); *H01L 21/02433* (2013.01); *H01L 21/02527* (2013.01); *H01L 21/02576* (2013.01); *H01L 21/02609* (2013.01); *H01L 21/0262* (2013.01)
USPC ............... 117/105; 117/103; 117/92; 117/89; 117/106; 117/929; 117/94; 117/95; 117/88; 117/101; 117/84; 117/68; 117/86; 423/446; 428/408

(56) References Cited

U.S. PATENT DOCUMENTS

| | | | |
|---|---|---|---|
| 5,961,717 A | 10/1999 | Kamo et al. | |
| 6,340,393 B1 * | 1/2002 | Yoshida | 117/86 |
| 6,858,080 B2 | 2/2005 | Linares et al. | |
| 7,063,742 B1 | 6/2006 | Ando et al. | |
| 7,258,742 B2 * | 8/2007 | Higuchi et al. | 117/86 |
| 7,459,024 B2 * | 12/2008 | Linares et al. | 117/84 |
| 7,560,086 B2 * | 7/2009 | Linares et al. | 423/446 |
| 7,964,280 B2 * | 6/2011 | Williams et al. | 428/408 |
| 8,119,241 B2 * | 2/2012 | Ueda et al. | 428/408 |
| 8,187,380 B2 * | 5/2012 | Linares et al. | 117/105 |
| 2003/0131787 A1 | 7/2003 | Linares et al. | |
| 2005/0056206 A1 * | 3/2005 | Linares et al. | 117/68 |
| 2005/0056208 A1 * | 3/2005 | Linares et al. | 117/68 |
| 2005/0061233 A1 * | 3/2005 | Linares et al. | 117/84 |
| 2005/0109268 A1 * | 5/2005 | Linares et al. | 117/68 |
| 2005/0202664 A1 | 9/2005 | Jawarani | |
| 2007/0272929 A1 * | 11/2007 | Namba et al. | 257/77 |
| 2009/0127506 A1 * | 5/2009 | Twitchen et al. | 252/182.34 |

OTHER PUBLICATIONS

Koizumi; Growth and Characterization of Phosphorus Doped n-Type Diamond Thin Films; Phys. Stat. Sol. (a); 172, 71; 1999.*

Plano et al. Phosphorous Incorporation in Plasma Deposited Diamond Films; Appl. Phys. Lett. 64, 1094; 1994.*

Gheeraert et al. "Electronic States of Phosphorus in Diamond"; Diamond and Related Materials; vol. 9, Issues 3-6, pp. 948-951; May 2000.*

Koizumi et al. "Growth and Characterization of Phosphorous Doped N-Type Diamond Thin Films"; Diamond and Related Materials; vol. 7, Issues 2-5, pp. 540-544; Feb. 1998.*

Haenen et al., "Phonon-assisted electronic transitions in phosphorus-doped n-type chemical vapor deposition diamond firms," Diamond and Related Materials, vol. 10, 2001, pp. 439-443.

Kato et al., "N-type doping of (001)-oriented single-crystalline diamond by phosphorus," Applied Physics Letters, vol. 86, 2005, pp. 222111-1-222111-3.

Koizumi et al., "Growth and characterization of phorphorous doped {111} homoepitaxial diamond thin films," Applied Physics Letters, vol. 71, 1997, pp. 1065-1067.

Koizumi et al., "Phosphorus-doped chemical vapor deposition of diamond," Diamond and Related Materials, vol. 9, 2000, pp. 935-940.

Nesladek, "Conventional n-type doping in diamond: state of the art and recent progress," Semiconductor Science and Technology, vol. 20, 2005, pp. R19-R27.

Saito et al., "Morphology and semiconducting properties of homoepitaxially grown phosphorus-doped (100) and (111) diamond films by microwave plasma-assisted chemical vapor depostiion using triethylphosphine as a dopant source," Journal of Crystal Growth, vol. 191, 1998, pp. 723-733.

Saito et al., "Synthesis of phosphorus-doped homoepitaxial diamond by microwave plasma-assisted chemcial vapor deposition using triethylphosphine as the dopant," Diamond and Related Materials, vol. 7, 1998, pp. 560-564.

U.S. Appl. No. 11/883,488, U.S. Office Action, Jun. 10, 2010, pp. 1-6.

U.S. Appl. No. 11/883,488, U.S. Office Action, May 14, 2009, pp. 1-7.

U.S. Appl. No. 11/883,488, U.S. Office Action, Nov. 29, 2010, pp. 1-8.

U.S. Appl. No. 11/883,488, U.S. Office Action, Oct. 31, 2008, pp. 1-6.

U.S. Appl. No. 13/074,284, U.S. Office Action, Sep. 6, 2011, pp. 1-6.

Ushizawa et al., "Boron concentration dependence of Raman spectra on (100) and {111} facets of B-doped CVD diamond," Diamond and Related Materials, vol. 7, 1998, pp. 1719-1722.

Japanese Office Action issued on Oct. 26, 2010 in corresponding Japanese Patent Application No. 2006-017095 (English translation is provided).

Toshihiko Nishimori et al.; "n-type high-conductive epitaxial diamond film prepared by gas source molecular beam epitaxy with methane and tri-n-butylphosphine" Applied Physics Letters; 1997; vol. 71; pp. 945-947.

* cited by examiner

*F i g . 1*
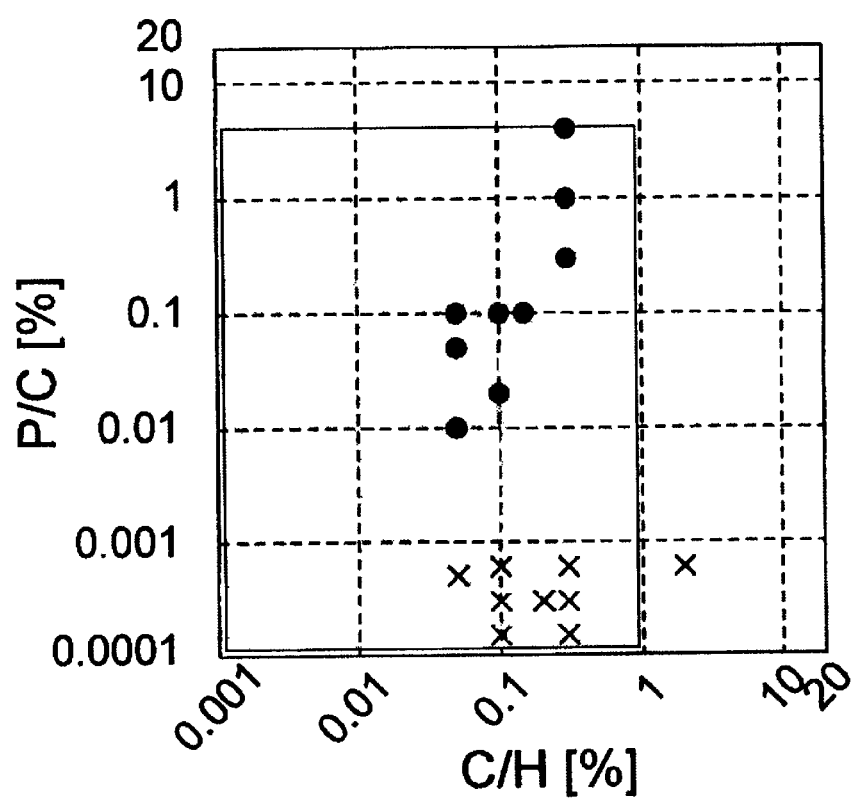
Claims, Examples, and Comparative Examples
in Japanese patent application No. 8-252376

FILM OF N TYPE (100) ORIENTED SINGLE CRYSTAL DIAMOND SEMICONDUCTOR DOPED WITH PHOSPHOROUS ATOMS, AND A METHOD OF PRODUCING THE SAME

CROSS REFERENCE TO RELATED APPLICATION

This application is a Continuation of U.S. application Ser. No. 13/074,284, filed on Mar. 29, 2011, now abandoned which claims priority to U.S. application Ser. No. 11/883,488, filed on Aug. 1, 2007, now abandoned which claims priority to Japanese Application No. 2005-027181, filed Feb. 3, 2005, and of which is the national phase under 35 U.S.C. §371 of PCT International Application No. PCT/JP2006/301210 which has an International filing date of Jan. 26, 2006, which designated the United States of America, all of which are hereby incorporated by reference as if fully set forth herein.

TECHNICAL FIELD

The film of n type (100) oriented single crystal diamond according to the present invention can be applied to such electric devices as ultraviolet light emitting devices, electron emission sources, high frequency transistors, high power transistors, X ray and particle ray sensors, and X ray and particle position sensors.

The present invention relates to a method of preparing a film of n type (100) oriented single crystal diamond, and provides a manufacturing method according to which an n type (100) oriented diamond semiconductor that can make up such general semiconductor devices as ultraviolet light emitting elements, electron beam emission elements, power semiconductor elements and high frequency semiconductor elements can be formed efficiently.

BACKGROUND ART

Conventional single crystal diamond semiconductor films can be manufactured by the method of generating microwave plasma, and thus growing a diamond film which includes carbon and phosphorous on a heated diamond substrate within a vacuum container into which a gas including hydrogen, carbon and phosphorous atoms has been introduced (Patent Document 1). Here, it is described that "In order to grow a single crystal diamond film, it is desirable to use heteroepitaxially grown diamond or a single crystal diamond substrate. Though any of the (111) plane, the (110) plane or the (100) plane may be used, the (111) plane is desirable," and according to the document, a film of n type (111) oriented single crystal diamond semiconductor doped with phosphorous atoms is fabricated using the (111) plane of a diamond crystal in an embodiment, and the generation thereof is confirmed. Furthermore, in the disclosed scope of the invention, there is a description that this invention can be practiced in a region where the ratio of the number of atoms for P/C of P in phosphine $PH_3$ to C of methane $CH_4$ is such that P/C≤4% and the ratio of the number of atoms for C/H of C in $CH_4$ to H of hydrogen $H_2$ is such that C/H≤1%, and that n type (111) oriented single crystal diamond semiconductor, which are examples for defining the scope of the invention and designated as • in FIG. 1, can be formed. Meanwhile, it is described that in comparative examples designated as x it cannot be obtained on the (111) plane.

Concerning this, the inventors published some information similar to the above (Non-patent Documents 1 and 2).

However, as far as the present inventors know, there are no preceding examples that confirmed the existence of an n type diamond semiconductor on the (100) plane in any patent or academic paper. In addition, there is a reported example that no n type diamond semiconductor grew on the (100) plane under the synthesis conditions on the (111) plane (Non-patent Document 4). As described above, conventional n type diamond semiconductors have been obtained only with a particular ratio of the number of atoms only on the (111) plane. Even when such methods are attempted, however, a film of n type (100) oriented single crystal diamond semiconductor, which is important in the industry, could not be obtained, due to poor reactivity.

There was attempt to manufacture films of (100) oriented single crystal diamond semiconductor which allow provision of an enlarged area and flattening through polishing relatively easily, and low interface state density, which are suitable for semiconductor devices, compared with diamond substrates having a (111) substrate. The ratio of phosphorous atoms to carbon atoms in the gas which is used as a raw material, however, is at a level of approximately several tens of ppm to several thousands of ppm at the highest. This is because it was firmly believed that increase in the amount of n type atoms added to be harmful to the crystallinity of the fabricated n type diamond semiconductor single crystal film.

For example, in preparing p type diamond semiconductors, diborane $B_2H_6$ is used as an acceptor, but also it has been carried out with a ratio B/C of diborane to $CH_4$ of approximately several tens of ppm to several thousands of ppm. Though there are rare examples of experiments being conducted with a concentration of as high as 2000 ppm (Non-patent Document 3), the ratio in these is 0.2% at the highest. The crystallinity of diamond becomes poor when the concentration is further increased.

The n type (100) oriented single crystal diamond semiconductor, in particular, can show properties that provision of an enlarged area and flattening through polishing are relatively easy and the interface state density is low, and thus the (100) oriented single crystal diamond films are thus suitable for devices and have high utility value. However, n type conduction on (100) oriented diamond could not be attained substantially.

Non-patent Document 1: S. Koizumi et al., Appl. Phys. Lett., 71, 1065 (1997)
Non-patent Document 2: S. Koizumi et al., Diamond and Related Materials, 9, 935 (2000)
Non-patent Document 3: K. Ushizawa et al., Diamond and Related Materials, 7, 1719 (1998)
Non-patent Document 4: M. Nesladek, Semicond. Sci. Technol., 20, R19 (2005)

DISCLOSURE OF INVENTION

Problems that the Invention is to Solve

The present inventors diligently continued research in order to provide a film of an n type (100) oriented single crystal diamond semiconductor, as well as a method for manufacturing the film of an n type (100) oriented single crystal diamond semiconductor, and as a result, developed a film of an n type (100) oriented single crystal diamond semiconductor, as well as a manufacturing method for the same. The present inventors used the phosphorous vapor in a concentration at a level which deviates from that of common knowledge for doping, and thus, solved the problem. That is to say, while the weight ratio of phosphorous atoms to carbon atoms in the vapor phase for epitaxial growth was usually the order of the ppm, here it is the order of percentage, and thus, it was found that the present invention could be achieved.

Means to Solve the Problem

The present inventors discovered that by the existence of an unthinkable amount in light of common knowledge, that is to say, a large amount of n type atoms (phosphorous atoms), in microwave plasma can solve the problems above described when diamond semiconductor is grown homoepitaxially using a plasma chemical vapor deposition method. The present invention provides a film of an n type (100) oriented single crystal diamond semiconductor doped with phosphorous atoms and a manufacturing method for the same.

That is to say, the present invention relates to a film of an n type (100) oriented single crystal diamond semiconductor doped with phosphorous atoms.

In addition, the present invention relates to a manufacturing method for a film of an n type (100) oriented single crystal diamond semiconductor, characterized in that (100) oriented diamond is epitaxially grown on a substrate of (100) oriented diamond, by means of chemical vapor deposition where there are supplied hydrogen, hydrocarbon and a phosphorous compound in the plasma vapor phase, wherein the ratio of phosphorous atoms to carbon atoms in the plasma vapor phase is no less than 0.1%, and the ratio of carbon atoms to hydrogen atoms is no less than 0.05%.

Furthermore, according to the present invention, the means of chemical vapor deposition may be one selected from among the methods represented by microwave CVD, filament CVD, DC plasma CVD and arc jet plasma CVD.

In addition, according to the present invention, a diamond substrate having an off angle of 0 degree to 10 degrees where the plane is inclined by 10 degrees from 0 in any direction from the (100) plane can be used as the diamond substrate.

Furthermore, according to the present invention, the weight ratio of phosphorous atoms to carbon atoms in the plasma vapor phase can be controlled, in order to control the properties of the semiconductor.

In addition, according to the present invention, the temperature on the surface of the substrate can be set to 800° C. to 1000° C.

Effects of the Invention

There is produced an n type (100) oriented single crystal diamond semiconductor for which enlarging of area and flattening are easy in accordance with the manufacturing method for an n type single crystal diamond semiconductor film of the present invention, in comparison with (111) oriented single crystal diamond semiconductor. Thus the n type (100) oriented single crystal diamond semiconductor can be used for developing general devices, and thus, have an extremely large impact into the industry, as it can achieve development of devices.

BRIEF DESCRIPTION OF DRAWINGS

FIG. 1 is a graph showing the claims a previous patent according to the prior art, as well as working examples and comparative examples thereof.

BEST MODE FOR CARRYING OUT THE INVENTION

The present invention provides a synthesizing method for (100) oriented diamond into which phosphorous is doped by the synthesizing method a phosphorous compound is added to a reaction gas in accordance with a microwave plasma method for synthesizing diamond using hydrogen and hydrocarbon as a raw material gas so that a specific composition is set for the reaction gas, and hydrogen that bonds to phosphorous is dissociated for a chemical vapor phase growth method represented by a microwave plasma CVD method, a DC plasma CVD method and the like, and a single crystal or polycrystal thin film of diamond including phosphorous atoms is epitaxially grown on a (100) oriented diamond substrate which has been placed in a reactive container and heated. In addition, according to the present invention, the ratio of phosphorous atoms to carbon atoms in the vapor phase is controlled, and thus, the properties of the semiconductor can be controlled.

Here, (100), (010) and (001) are referred to as Miller's indices, and are numeral values for determining the crystal plane. In diamond crystals, these three are equivalent.

Examples of substances which can be used as the hydrocarbon in the present invention include carbon dioxide, carbon monoxide, methane and the like.

Examples of gas including phosphorous atoms which can be used in the present invention include phosphine, trimethylphosphine, and the like.

Though the unit for synthesis used for controlling n type conduction in the present invention is a microwave plasma chemical vapor phase deposition (CVD) unit according to the prior art, and the unit is not limited to this. The same results can be expected when other types of equipment, such as equipment for microwave CVD, filament CVD, DC plasma CVD and arc jet plasma CVD, are used.

Though the vacuum container used in the present invention is operated under a pressure of approximately 10 Torr to 200 Torr, the pressure greatly depends on the unit, and is not limited to this. Though the temperature for reaction is approximately 600° C. to 1200° C., and a temperature ranging from 800° C. to 1000° C. is particularly preferable, the temperature also greatly depends on the reaction gas and the unit, and thus the present invention is not limited to this.

In the present invention, a (100) oriented diamond substrate or a substrate with an off angle of 0 degree to 10 degrees where the (100) plane is inclined by 0 degree to 10 degrees in any direction is used as the diamond substrate for epitaxially growing crystal. The minimum value of the off angle may be 0 degree, preferably 0.5 degree, and more preferably no less than 1.0 degree.

Though well known n type elements and a complex dopant, such as N+4Si or N+S, can be used as the n type element, it is generally preferable to use phosphorous atom.

Figure 3:
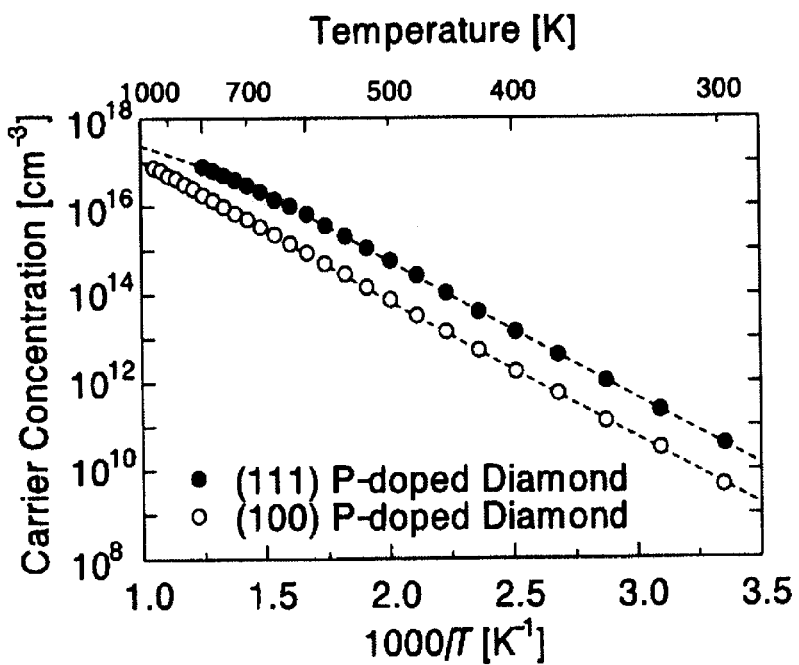
FIG. 3 is a graph showing dependency of the concentration of the carrier on the temperature.

FIG. 3 shows the results of examination of the dependency of the concentration of the carrier on the temperature for film of phosphorous doped n type (100) oriented single crystal diamond semiconductor which was obtained by the present

Example 1

In accordance with a microwave plasma chemical vapor phase synthesizing method, phosphine was added to hydrogen containing 0.2% of methane so that the ratio of phosphorous (P) to carbon (C) became 5% and the resulting gas was introduced into a reaction chamber having a pressure for synthesis of 50 Torr, and a diamond film was formed on the (100) oriented single crystal diamond having an off angle of 1.5 degrees (a diamond substrate where the plane direction is inclined by 1.5 degrees in any direction for the (100) plane), on the substrate at 900° C. The film was confirmed to have n type properties at room temperature by measuring the Hall effect, and the mobility thereof was 350 $cm^2/Vs$ and the concentration of the carrier was $3\times10^9$ $cm^{-3}$.

Example 2

In accordance with a microwave plasma chemical vapor phase synthesizing method, phosphine was added to hydrogen containing 0.5% of methane so that the ratio of phosphorous (P) to carbon (C) became 7.5% and the resulting gas was introduced into a reaction chamber kept at a pressure for synthesis of 75 Torr, and a diamond film was formed on the (100) oriented single crystal diamond having an off angle of 2.8 degrees, at 800° C. on the substrate. The film was confirmed to have n type properties at room temperature by measuring the Hall effect, and the mobility thereof was 47 $cm^2/Vs$ and the concentration of the carrier was $9\times10^9$ $cm^{-3}$.

Example 3

In accordance with a microwave plasma chemical vapor phase synthesizing method, phosphine was added to hydrogen containing 0.4% of methane so that the ratio of phosphorous (P) to carbon (C) became 5% and the resulting gas was introduced into a reaction chamber kept at a pressure for synthesis of 25 Torr, and a diamond film was formed on the (100) oriented single crystal diamond having an off angle of 0.5 degrees at 900° C. of the substrate. The film was confirmed to have n type properties at room temperature by measuring the Hall effect, and the mobility thereof was 230 $cm^2/Vs$ and the concentration of the carrier was $5\times10^9$ $cm^{-3}$.

Example 4

In accordance with a microwave plasma chemical vapor phase synthesizing method, phosphine was added to hydrogen containing 0.5% of methane so as to set of phosphorous (P) to carbon (C) to 2% and the resulting gas was introduced into a reaction chamber kept at a pressure for synthesis of 50 Torr, and a diamond film was formed on the (100) oriented single crystal diamond having an off angle of 5.8 degrees, at 1000° C. on the substrate. The film was confirmed to have n type properties at room temperature by measuring the Hall effect, and the mobility thereof was 340 $cm^2/Vs$ and the concentration of the carrier was $9\times10^9$ $cm^{-3}$.

Example 5

Figure 2:
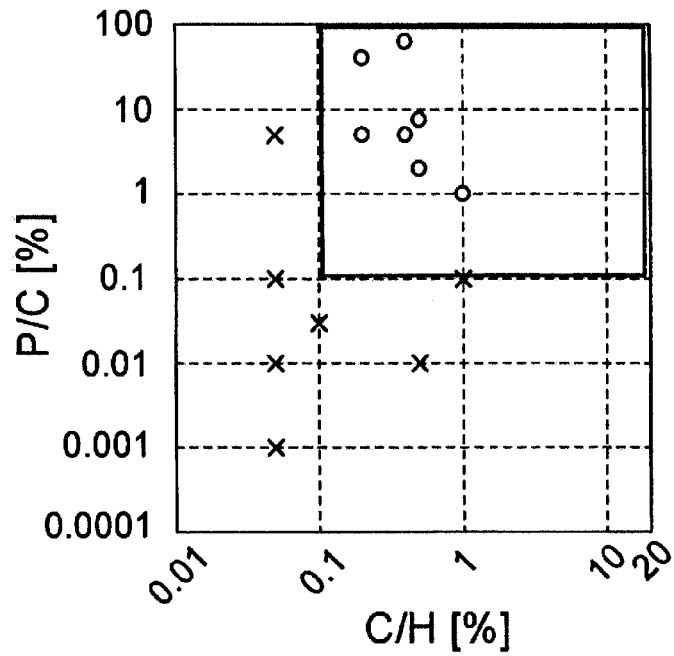
FIG. 2 is a graph showing the scope of claims of the present application, as well as working examples and comparative examples thereof.

In accordance with a microwave plasma chemical vapor phase synthesizing method, phosphine was added to hydrogen containing 1.0% of methane so as to set the ratio of phosphorous (P) to carbon (C) to 1% and the resulting gas was introduced into a reaction chamber kept at a pressure for synthesis of 25 Torr, and a diamond film was formed on the (100) oriented single crystal diamond having an off angle of 3.4 degrees, at 800° C. on the substrate. The film was confirmed to have n type properties at room temperature by measuring the Hall effect, and the mobility thereof was 90 $cm^2/Vs$ and the concentration of the carrier was $5\times10^9$ $cm^{-3}$.

n type diamond semiconductor single crystal films having working examples (100) plane that was substantiated by are designated as ○ in FIG. 2, can be attained. Meanwhile, it is described that comparative examples designated as x cannot attain films on the (100) plane.

Further, specific working examples according to the present invention are shown below.

Example 6

In accordance with a microwave plasma chemical vapor phase synthesizing method, phosphine was added to hydrogen containing 0.4% of methane so that the ratio of phosphorous (P) to carbon (C) became 63% and the resulting gas was introduced into a reaction chamber kept at a pressure for synthesis of 25 Torr, and a diamond film was formed on the (100) oriented single crystal diamond having an off angle of 1.6 degrees, at 900° C. on the substrate. The film was confirmed to have n type properties at room temperature by measuring the Hall effect, and the mobility thereof was 18 $cm^2/Vs$ and the concentration of the carrier was $1.5\times10^{10}$ $cm^{-3}$.

Example 7

In accordance with a microwave plasma chemical vapor phase synthesizing method, phosphine was added to hydrogen containing 0.2% of methane so that the ratio of phosphorous (P) to carbon (C) became 40% and the resulting gas was introduced into a reaction chamber having a pressure for synthesis of 25 Torr, and a diamond film was formed on the (100) oriented single crystal diamond having an off angle of 1.0 degrees, at 900° C. on the substrate. The film was confirmed to have n type properties at room temperature by measuring the Hall effect, and the mobility thereof was 5 $cm^2/Vs$ and the concentration of the carrier was $1.2\times10^{11}$ $cm^{-3}$.

Furthermore, a working example where the steepness in the distribution of the concentration of phosphorous in relation to the depth increased is shown below.

Example 8

In accordance with a microwave plasma chemical vapor phase synthesizing method, phosphine was added to hydrogen containing 0.4% of methane so that the ratio of phosphorous (P) to carbon (C) became 5% and the resulting gas was introduced into a reaction chamber having a pressure for synthesis of 25 Torr, and a diamond film was formed on the (100) oriented single crystal diamond having an off angle of 2.0 degrees, at 900° C. on the substrate.

The film was confirmed to have n type properties at room temperature by measuring the Hall effect. The distribution in the concentration of phosphorous in relation to the depth at the time was measured through SIMS.

Example 9

In accordance with a microwave plasma chemical vapor phase synthesizing method, phosphine was added to hydrogen containing 0.4% of methane so that the ratio of phosphorous (P) to carbon (C) became 5% and the resulting gas was introduced into a reaction chamber kept at a pressure for synthesis of 25 Torr, and a diamond film was formed on the (100) oriented single crystal diamond having an off angle of 0.5 degrees, at 900° C. on the substrate.

Figure 6:
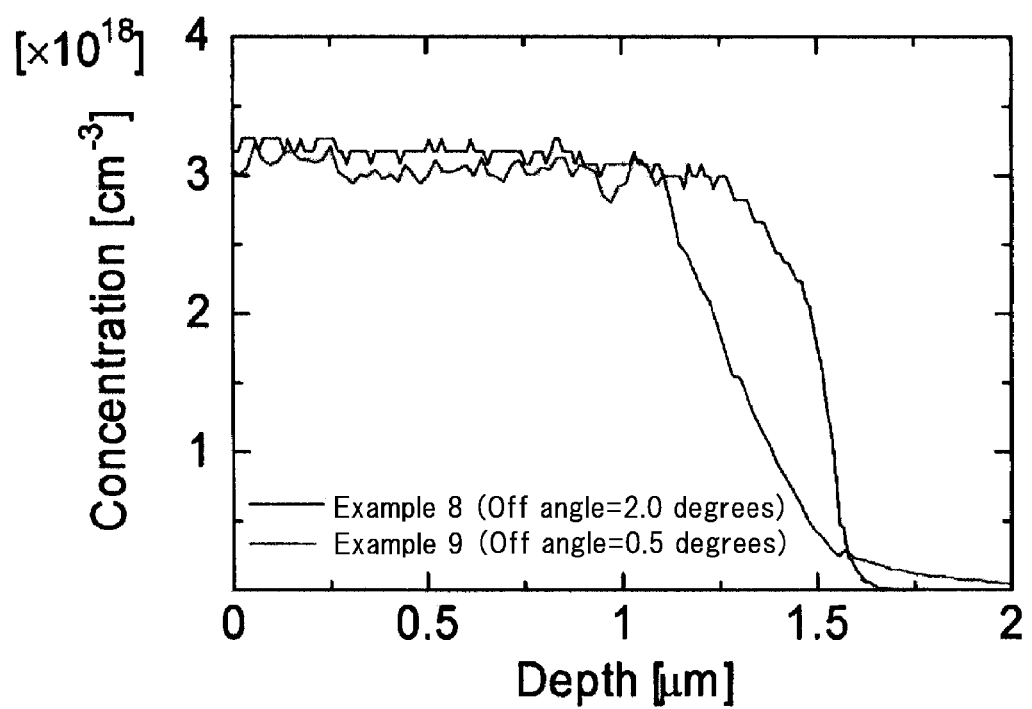
FIG. 6 is a graph showing the distribution in the concentration of phosphorous in relation to the depth in comparison with Examples 8 and 9 (with off angles).

The film was confirmed to have n type properties at room temperature through measurement using the Hall effect. The distribution in the concentration of phosphorous in relation to the depth is shown in FIG. 6, compared with the results of Example 8.

It was found that a suitable off angle for making the gradient in the concentration steep is no less than 1.0 degrees.

Figure 4:
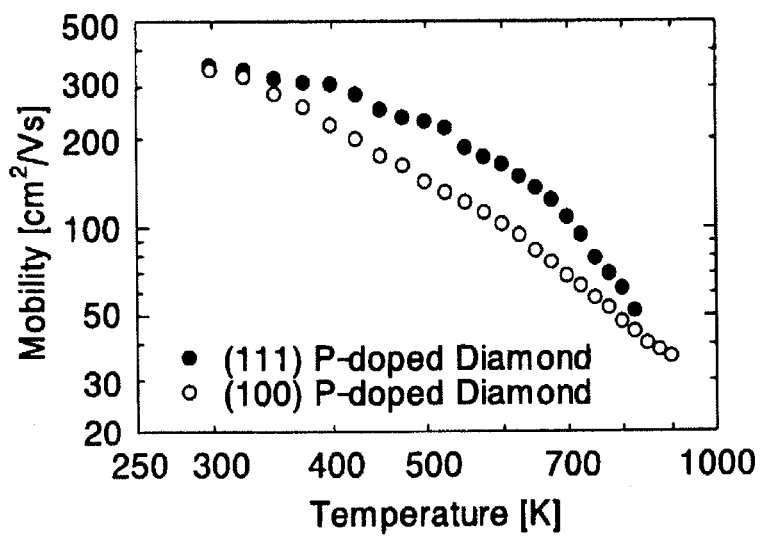
FIG. 4 is a graph showing dependency of the mobility on the temperature.
Figure 5:
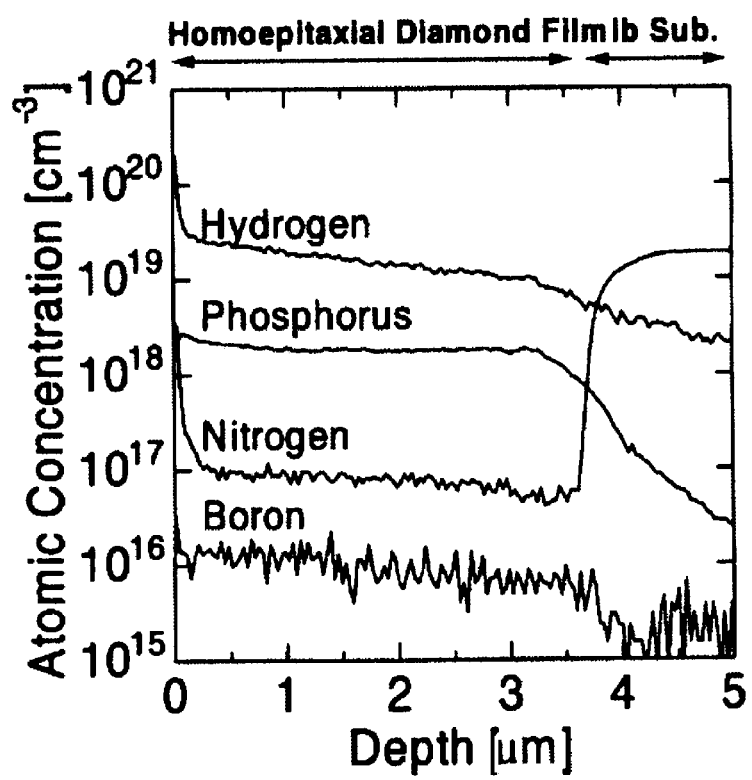
FIG. 5 is a graph showing profiles for respective elements in relation to the depth gained through SIMS analysis.

Phosphorous doped diamond was grown using a microwave plasma chemical vapor phase deposition unit, and the properties of the semiconductor were by measuring using the Hall effect, as shown in FIG. 4, and furthermore, the concentration of phosphorous was found through SIMS element analysis, as shown in FIG. 5, and thus, it was confirmed that phosphorous was doped without failure and control of n type conduction was possible.

The efficiency for taking in an n type dopant (phosphorous atoms) was different by no less than 100 between the (111) plane and the (100) plane. Under these circumstances, phosphorous is not taken in, even when doping is carried out in a range following conventional common knowledge, and n type conduction cannot be controlled. Meanwhile, the efficiency of doping depends on the rate of growth of diamond in such a manner that the efficiency for take-in increases as the rate increases. In this case, however, many defects are caused, or even if phosphorous is taken in, there is compensation, and thus, n type conduction is not exhibited.

The problem can be solved using a technology for effectively taking in phosphorous while suppressing the rate of growth (suppressing the amount of defects), as clarified in this specification.

FIG. 3 shows the results of measurement of the Hall effect of the n type (100) oriented single crystal diamond semiconductor gained in the working examples.

In contrast to these examples, n type properties could not be confirmed when the atomic ratio was in a range commonly known for conventional doping, as shown in the following comparative examples.

Comparative Example 1

Phosphine was added to hydrogen containing 0.05% of methane so that the ratio of phosphorous (P) to carbon (C) became 0.001% and the resulting gas was introduced into a reaction chamber having a pressure for synthesis of 25 Torr, and a diamond film was formed on the (100) oriented single crystal diamond having an off angle of 1.3 degrees, at 800° C. on the substrate. No good epitaxial film having a (100) plane was formed, and n type conduction could not be confirmed according to the results of measurement using the Hall effect.

Comparative Example 2

Phosphine was added to hydrogen containing 0.05% of methane so that the ratio of phosphorous (P) to carbon (C) became 0.01% and the resulting gas was introduced into a reaction chamber having a pressure for synthesis of 100 Torr, and a diamond film were formed on the (100) oriented single crystal diamond having an off angle of 0.9 degrees and formed on the (111) plane of single crystal diamond having an off angle of 1.0 degrees, respectively, at 900° C. on the substrate. Though the n type properties of the gained film could be confirmed on the (111) surface at room temperature by measuring the Hall effect, and the mobility 50 cm$^2$/Vs and the concentration of the carrier was $1.0 \times 10^{11}$ cm$^{-3}$, no good epitaxial film having a (100) plane was formed, and n type conduction could not be confirmed according to the results of measurement using the Hall effect.

Comparative Example 3

Phosphine was added to hydrogen containing 0.1% of methane so that the ratio of phosphorous (P) to carbon (C) became 0.03% and the resulting gas was introduced into a reaction chamber having a pressure for synthesis of 50 Torr, and a diamond film were formed on the (100) oriented single crystal diamond having an off angle of 3.0 degrees and formed on the (111) oriented single crystal diamond having an off angle of 0.5 degrees, respectively, at 900° C. on the substrate. Though the n type properties of the gained film could be confirmed on the (111) plane at room temperature by measuring the Hall effect, and the mobility 45 cm$^2$/Vs and the concentration of the carrier was $1.2 \times 10^{11}$ cm$^{-3}$, no good epitaxial film having a (100) plane was formed, and n type conduction could not be confirmed according to the results of measurement using the Hall effect.

Comparative Example 4

Phosphine was added to hydrogen containing 1% of methane so that the ratio of phosphorous (P) to carbon (C) became 0.1% and the resulting gas was introduced into a reaction chamber having a pressure for synthesis of 75 Torr, and a diamond film was formed on the (100) oriented single crystal diamond having an off angle of 01.6 degrees, at 850° C. on the substrate. No good epitaxial film having a (100) plane was formed, and n type conduction could not be confirmed according to the results of measurement using the Hall effect.

Comparative Example 5

Phosphine was added to hydrogen containing 0.5% of methane so that the ratio of phosphorous (P) to carbon (C) became 0.01% and the resulting gas was introduced into a reaction chamber having a pressure for synthesis of 75 Torr, and a diamond film was formed on the (100) oriented single crystal diamond having an off angle of 1.6 degrees, at 850° C. on the substrate. No good epitaxial film having a (100) plane was obtained, and n type conduction could not be confirmed according to the results of measurement using the Hall effect.

Comparative Example 6

Phosphine was added to hydrogen containing 0.05% of methane so that the ratio of phosphorous (P) to carbon (C) became 0.1% and the resulting gas was introduced into a reaction chamber having a pressure for synthesis of 85 Torr, and a diamond film was formed on the (100) oriented single crystal diamond having an off angle of 2.7 degrees, at 900° C. on the substrate. No good epitaxial film having a (100) plane was obtained, and n type conduction could not be confirmed according to the results of measurement using the Hall effect.

Comparative Example 7

Phosphine was added to hydrogen containing 0.05% of methane so that the ratio of phosphorous (P) to carbon (C) became 5% and the resulting gas was introduced into a reaction chamber having a pressure for synthesis of 80 Torr, and a diamond film was formed on the (100) oriented single crystal diamond having an off angle of 2.7 degrees, at 900° C. on the substrate. No good epitaxial film having a (100) plane was gained, and n type conduction could not be confirmed according to the results of measurement using the Hall effect.

INDUSTRIAL APPLICABILITY

In the manufacturing method of an n type single crystal diamond semiconductor film of the present invention, production of an enlarged area and flattening are easy and the interface state density can be made low in the n type (100) oriented single crystal diamond semiconductor, in comparison with (111) oriented single crystal diamond semiconductor. The (100) oriented single diamond crystal film, can be used for developing general semiconductor devices, and thus, has an extremely large impact in the industry, as they can be utilized for every type of development of devices. As examples of devices, the n type (100) oriented single crystal diamond according to the present invention can be applied to such electric devices as ultraviolet light emitting devices, electron emission sources, high frequency transistors, high power transistors, X ray and particle ray sensors, and X ray and particle position sensors.

What is claimed:

1. A method of producing an n-type single crystal diamond semiconductor film with (100) orientation, comprising the steps of:
    providing a unit of forming a plasma vapor phase to carry out chemical vapor deposition;
    installing a substrate in the unit, the substrate made of a diamond with (100) orientation having an off-angle of 0.5 degrees to 10 degrees in any direction from the (100) plane;
    providing hydrogen, hydrocarbon, and a phosphorous compound into the plasma vapor phase of the unit, in the condition of:
        the ratio of phosphorous atoms to carbon atoms in the plasma vapor phase being 5% or more and 63% or less, and
        the ratio of carbon atoms to hydrogen atoms being no less than 0.1%; and
    epitaxially growing a single crystal thin film on the diamond substrate, the crystal having (100) orientation made of an n-type diamond semiconductor doped with phosphorous.

2. The method of producing an n-type single crystal diamond semiconductor film with (100) orientation, according to claim 1, wherein the ratio of carbon atoms to hydrogen atoms is 0.2% or more.

3. The method of producing an n-type single crystal diamond semiconductor film with (100) orientation, according to claim 1, wherein the chemical vapor deposition is microwave CVD, filament CVD, DC plasma CVD, or arc jet plasma CVD.

4. The method of producing an n-type single crystal diamond semiconductor film with (100) orientation, according to claim 1, wherein the ratio of phosphorous atoms to carbon atoms in the plasma vapor phase is controlled so that the properties of the semiconductor can be controlled.

5. The method of producing an n-type single crystal diamond semiconductor film with (100) orientation, according to claim 1, wherein a temperature on the surface of the substrate is from 600° C. to 1200° C.

6. The method of producing an n-type single crystal diamond semiconductor film with (100) orientation, according to claim 1, wherein the ratio of phosphorous atoms to carbon atoms in the plasma vapor phase is 5% or more and 63% or less, and wherein the ratio of carbon atoms to hydrogen atoms is 0.2% or more and 1% or less.

7. The method of producing an n-type single crystal diamond semiconductor film with (100) orientation, according to claim 1, wherein the obtained n-type single crystal diamond semiconductor film has a mobility in the range of 5 to 350 $cm^2$/Vs.

8. The method of producing an n-type single crystal diamond semiconductor film with (100) orientation, according to claim 1, wherein the obtained n-type single crystal diamond semiconductor film has a carrier concentration in the range of $3 \times 10^9$ to $1.2 \times 10^{11}$ $cm^{-3}$ at room temperature.

* * * * *